United States Patent [19]

Nishida et al.

[11] Patent Number: 4,838,979
[45] Date of Patent: Jun. 13, 1989

[54] APPARATUS FOR PROCESSING SUBSTRATE SURFACE

[75] Inventors: Masami Nishida, Kyoto; Nobutoshi Orgami, Shiga, both of Japan

[73] Assignee: Dainippon Screen Mfg. Co., Ltd., Japan

[21] Appl. No.: 98,476

[22] Filed: Sep. 18, 1987

[30] Foreign Application Priority Data

Sep. 19, 1986 [JP] Japan .................................. 61-223334

[51] Int. Cl.[4] .............................................. C23F 1/02
[52] U.S. Cl. ..................................... 156/345; 118/52; 118/50; 118/64; 118/320; 134/140; 134/157
[58] Field of Search .................. 156/345, 640; 118/52, 118/54, 50, 64, 320; 134/140, 149, 155, 157

[56] References Cited
FOREIGN PATENT DOCUMENTS 1143868 3/1983 Canada .................................. 118/52

Primary Examiner—David L. Lacey
Assistant Examiner—Thi Dang
Attorney, Agent, or Firm—Ostrolenk, Faber, Gerb & Soffen

[57] ABSTRACT

An improved processing apparatus for a substrate surface, which provides uniform and smooth air flows A within the processing chamber 26, by which an even thin film of a processing solution can be formed on the substrate surface. Undersirable surplus processing solution is collected primarily in a first chamber 13. A second chamber 15 is provided which is separate from the first chamber and pneumatically communicated therewith through a slit 16.

10 Claims, 2 Drawing Sheets or the like (hereinafter referred to generally as substrate), while supplying a processing solution, such as liquid photoresist, developing solution, etching agent, liquid dopant or the like (hereinafter referred to generally as processing solution), onto the surface thereof.

APPARATUS FOR PROCESSING SUBSTRATE SURFACE

BACKGROUND OF THE INVENTION

The present invention relates generally to an apparatus for processing a substrate surface, and more particularly to such an apparatus that rotates a substrate, such as semiconductor wafer, glass plate, ceramic board or the like (hereinafter referred to generally as substrate), while supplying a processing solution, such as liquid photoresist, developing solution, etching agent, liquid dopant or the like (hereinafter referred to generally as processing solution), onto the surface thereof.

Apparatus of this general type have been broadly used in the art. One such apparatus is shown in Japanese unexamined laid-open application (Kokai) No. 59-90928, a typical illustration of which is shown in FIG. 3.

Referring to FIG. 3, the apparatus includes a rotary chuck 102 for holding a substrate 101 thereon and rotating it at a predetermined rate, a nozzle 103 disposed above the chuck 102 for supplying a processing solution onto the upper surface of the substrate, and a housing 104 provided in such a manner as enclose the substrate 101 therein.

The housing 104 defines a processing chamber, and the chamber is evacuated through an suction conduit 117 connected to a lower part of the housing, which is in turn connected with an exhauster (not shown). At the top end of the housing 104 there is provided an opening 105 in order to introduce air into the chamber in cooperation with evacuation by the exhauster. Surplus processing solution drains through a drain 114 which is also connected to the lower part of the housing.

Adjacent to the rotary chuck 102 there is provided a rectifying plate 107 in the shape of a flat ring having a declining peripheral edge. The rectifying plate 107 is mounted eccentrically to the chuck 102 so that the peripheral edge of the rectifying plate 107 sticks out biasedly to the portion to which the suction conduit 117 is connected.

Eccentricity of the rectifying plate 107 narrows a gap formed between the peripheral edge of the rectifying plate 107 and the inner surface of the housing 104, to increase the pneumatic resistance at that point so that processing of the substrate can be carried out uniformly throughout the entire surface thereof, e.g. in the case of forming a thin film of a photoresist, an even and uniform thin film can be obtained.

While the foregoing apparatus may be advantageous in terms of processing a substrate evenly and uniformly throughout the entire surface thereof, there are still some problems to be solved. That is, in the foregoing apparatus, since the gap formed between the peripheral edge of the rectifying plate 107 and the inner surface of the housing 104 is adjusted by eccentricity of the rectifying plate 107, the adjustment is difficult, though not impossible, and it requires the accuracy of production of the rectifying plate and the housing in order to control an air flow introduced into the processing chamber.

The foregoing apparatus has a disadvantageous structure that a processing solution is likely to enter the suction conduit 117. If a processing solution, particularly a liquid photoresist, adheres to and accumlates on the inner surface of the suction conduit 117, the conduit is narrowed and affect the air flow within the processing chamber.

SUMMARY OF THE INVENTION

Accordingly, it is a principal object of the present invention to provide an improved processing apparatus which processes a substrate evenly and uniformly throughout the entire surface thereof.

It is another object of the invention to provide a processing apparatus which prevents a processing solution from entering a suction conduit through which evacuation of the processing chamber is carried out.

It is a further object of the invention to provide a processing apparatus which makes an air flow applied to a substrate even and uniform throughout the entire surface thereof.

The aforementioned objects are accomplished by the present invention, with an apparatus which includes an approximately cylinderical housing defining a processing chamber therein, the housing having a rim on the top end thereof, said rim defining an opening through which air is introduced into the chamber, holding means rotatably provided at the center of said chamber for fixedly holding a substrate to be processed thereon, rotation means coupled with said holding means for rotating the substrate at a predetermined rate, solution supply means disposed above said holding means for supplying a predetermined processing solution onto the substrate surface, evacuation means pneumatically connected with said processing chamber for evacuating the processing chamber to cause an air flow within the same, a rectifying plate mounted immediately under the holding means and concentrically with a rotational center thereof for rectifying an air flow introduced into the chamber, said rectifying plate having a circular edge and a declined surface which extends downward as it goes outward, a first auxiliary chamber defined in a peripheral bottom part of the housing for collecting a surplus processing solution from the substrate surface, and a second auxiliary chamber defined under the rectifying plate, said second chamber being separated from and pneumatically communicating with said first chamber.

Preferably, the second chamber is connected with at least two evacuation conduits symmetrically with respect to the rotational center of the holding means, and the conduits are in turn connected with the evacuation means.

It is preferable that a partition wall is disposed between the first and second chambers, said wall extending upward from the bottom of the processing chamber so as to allow a pneumatic communication between the first and second chambers.

It is also preferable that the peripheral edge of the rectifying plate locates lower than the upper end of the partition wall.

Other novel features and advantages of the present invention will become apparent in the course of the following detailed description taken together with the accompanying drawings, which are directed only to the understanding of the invention and not to the restriction of the scope of the invention.

DETAILED DESCRIPTION OF PREFERRED EMBODIMENTS

Figure 1:
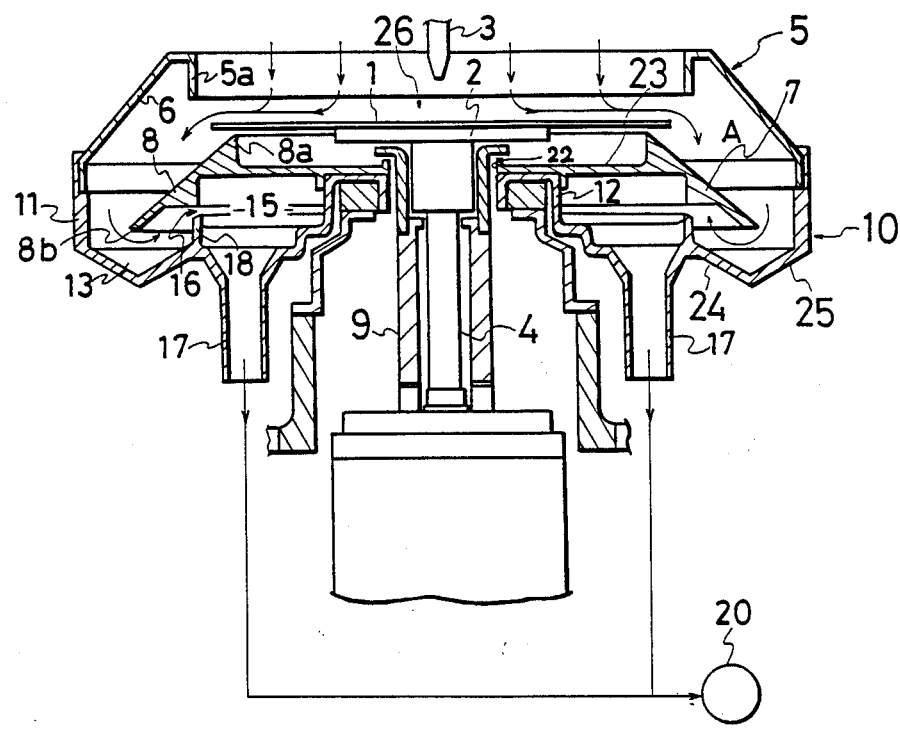
FIG. 1 is a schematic elevational view of an apparatus according to the present invention.
Figure 3:
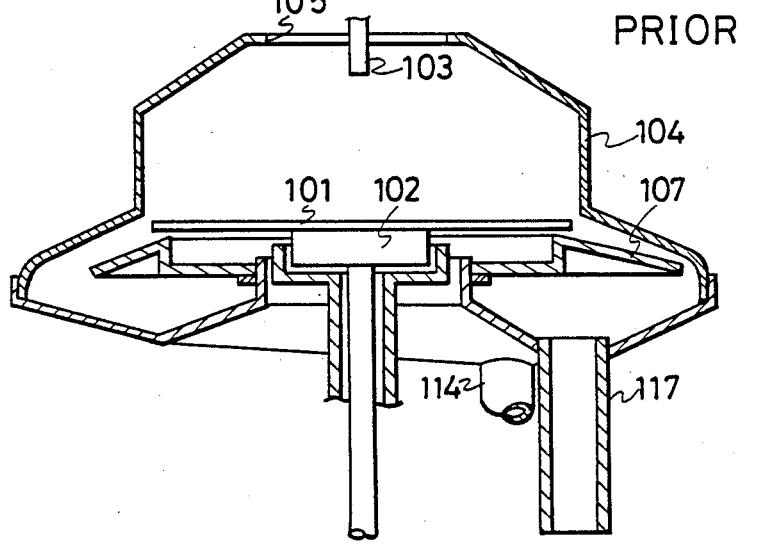
FIG. 3 is a schematic elevational view of a conventional apparatus.
Figure 2:
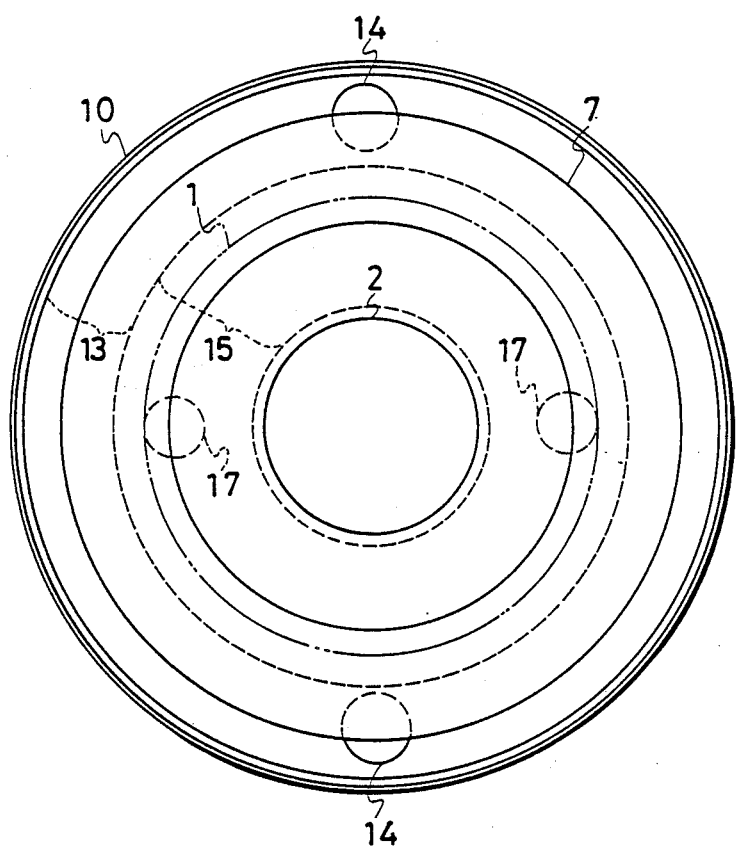
FIG. 2 is a schematic plane view of FIG. 1 when an upper housing 5 is removed.

Referring to FIGS. 1 and 2, an apparatus according to the present invention generally comprises an upper housing 5 and a lower housing 10, which are removably engaged with each other at a step provided on the inner peripheral edge of the lower housing. The apparatus generally forms a cylindrical shape, which defines a processing chamber 26 within the housings 5 and 10. A rotary chuck 2 is provided within the chamber 26, and is designed so that the chuck 2 is positioned at the center of the chamber 26 and that the chuck holds a substrate 1 to be processed thereon. The chuck 2 is coupled to a rotary shaft 4 which is driven by a motor (not shown). The rotary shaft 4 is housed within a sheath 9 extending along it.

At the top end of the upper housing 5 there is provided a rim 5a which defines an opening, through which clean air is introduced into the chamber. A nozzle 3 is provided above the chuck 2 in such a manner as to be directed to the center of the substrate 1, through which a desired processing solution is supplied onto the substrate.

The upper housing 5 includes an outward-declined shoulder 6, which is designed to direct air introduced through the opening 5a downward.

The lower housing 10 includes a trunk wall 11 and a bottom part 13, and the bottom part 13 comprises inclined walls 24 and 25, to form a first auxiliary chamber at the bottom part. As can be seen typically in FIG. 2, a pair of drains 14 are connected with the first auxiliary chamber 13. The drains are disposed symmetrically with respect to the center of the chamber.

Around the rotary chuck 2, there is provided a ring-shaped rectifying plate 7 for rectifying the flow of air introduced into the processing chamber 26. The rectifying plate 7 mounted on the chuck 2 comprises a substantially flat member 23 extending horizontally and a peripheral surface 8 extends outwardly and downwardly from a position immediately below the substrate 1. A gap between the inner peripheral edge 22 of plate 7 and the sheath 9 is designed to be as small as possible. Another gap between the upper edge 8a of the rectifying plate 7 and the undersurface of the substrate 1 is also designed to be as small as possible. In order to prevent undesirable particles of the surplus processing solution from entering these gaps, an inert gas is supplied to blow outward therefrom, a detailed explanation or illustration on which is not necessary because it is a well-known technique in the art.

The rectifying plate 7 defines a second auxiliary chamber 15 thereunder, which is separated, by a partition wall 18, from the first auxiliary chamber 13. The partition wall 18 extend upwards so as to define a slit 16 between the upper end of the partition wall 18 and the lower end 8b of the rectifying plate. It is most preferable that the difference in elevation between the slit 16 and the lower end 8b of the rectifying plate be large enough to prevent the undesirable particles of the surplus processing solution from entering the second auxiliary chamber. Further, it is also preferable that the bottom part of the first auxiliary chamber 13 be situated at a lowermost location.

The second auxiliary chamber 15 communicate pneumatically with the first auxiliary chamber 13 through the slit 16. As can be clearly seen in FIG. 2, a pair of evacuation conduits 17 are connected to the second auxiliary chamber 15, in which the conduits are disposed symmetrically with respect to the center of the chamber. The conduits 17 are in turn pneumatically connected with an exhauster 20, by which evacuation of the processing chamber 26 is carried out.

Operation of this apparatus is carried out as follows. The substrate 1 is mounted on the rotary chuck 2 so that the center of the substrate is coaxial with that of the chuck. The exhauster 20 is then actuated to evacuate the processing chamber 26 through the conduits 17.

A processing solution, e.g. liquid photoresist, is supplied from the nozzle 3 onto the center of the substrate surface, and simultaneously the substrate 1 is rotated at a predetermined rate. The processing solution supplied on the substrate spreads evenly and uniformly throughout the entire surface thereof as the substrate rotates, to form a thin film of the processing solution thereon. Surplus processing solution flows outward in the form of particles due to the centrifugal force acting on the substrate. Such particles are flung against the declined inner wall 6, by which are directed downward at the peripheral part within the chamber.

In response to evacuation by the exhauster 20, air is introduced, through the opening 5a provided on the top end of the upper housing, into the processing chamber 26. Air flows are effected radially as shown by arrows A (FIG. 1). Cooperation of both the declined inner wall 6 and the rectifying plate 7 causes the air flow to run downward smoothly. It is possible that some of the particles of surplus processing solution are splashed back over the rectifying plate 7. However, in such a case, the undesirable particles are directed downward by the air flow rectified by the rectifying plate.

The air flow turns inward at the first auxiliary chamber 13 defined at the bottom part of the lower housing, and enters the second auxiliary chamber through the slit 16 defined between the first auxiliary chamber and second auxiliary chamber.

The slit 16 applies a pneumatic resistance to the air flow. Most of the particles of the surplus processing solution are collected and accumulated in the first auxiliary chamber 13, which is in turn drained through the drains 14. A small portion of the particles in the form of mist run together with the air flow and enter the second auxiliary chamber 15 through the slit 16, and are further evacuated through the conduits 17.

As can be clearly understood, air introduced into the processing chamber 26 flows radially along the upper surface of the substrate 1, to evenly and uniformly form a thin film of the processing solution on the entire surface of the substrate. The surplus processing solution flung by a centrifugal force is directed downward at the peripheral part of the processing chamber, by cooperation of the declined inner wall 6 of the upper housing, the rectifying plate 8 and the smooth air flow. The surplus processing solution is collected and accumulated in the first auxiliary chamber 13 which is defined at the bottom part of the lower housing, through which the most of the surplus processing solution is drained.

Since the second auxiliary chamber 15 is separated from the first auxiliary chamber by the partition 18, though both the chambers pneumatically communicate with each other through the slit 16, the surplus processing solution in the form of particles is collected in the first auxiliary chamber 13 and do not to enter the second auxiliary chamber 15. Indeed a very small part of the surplus processing solution enters chamber 15 in the form of mist, but it can be disregarded because it is evacuated together with air through the conduits 17.

While the invention has been illustrated and described as embodied a processing apparatus, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by letters patent is set forth in the appended claims.

We claim:

1. Apparatus for processing a substrate surface, said apparatus comprising:
   an approximately cylindrical housing defining a processing chamber therein, said housing having a rim on the top end thereof, said rim defining an opening through which air is introduced into the chamber;
   rotation means for fixedly holding a substrate to be processed along a horizontal surface substrate plane at the center of said chamber and for rotating said substrate about a rotary axis;
   solution supply means for supplying a predetermined processing solution onto a top surface of said substrate;
   a rectifying plate mounted immediately under said horizontal substrate plane, said rectifying plate having a frustoconical outer surface which is coaxial with said rotary axis of said rotation means, said outer surface extending downwardly and outwardly and having a bottom peripheral edge;
   means defining a first auxiliary chamber located in a peripheral bottom part of the housing for collecting any surplus solution leaving the substrate surface;
   means defining a second auxiliary chamber located under said rectifying plate, said second chamber being separated from and pneumatically communicating with said first chamber;
   evacuation means cooperating with said rectifier plate for causing air entering said opening at said rim of said housing to flow along a path from said top surface of said substrate to said first auxiliary chamber, then to said second auxiliary chamber;
   means for preventing most of the surplus solution collected in said first auxiliary chamber from entering said second auxiliary chamber; and
   drain means for removing the surplus solution collected in said first auxiliary chamber.

2. The apparatus as set forth in claim 1, further comprising at least two evacuation conduits connected to said second auxiliary chamber symmetrically with respect to the rotational axis of said rotation means, said conduits being connected to said evacuation means.

3. The apparatus as set forth in claim 1 or 2, wherein said drain means comprises a plurality of drains connected with said first chamber for draining surplus solution collected therein.

4. The apparatus as set forth in claim 1, wherein said preventing means comprises a partition wall disposed between said first and second chambers, said wall extending upward from a bottom of said processing chamber and allowing a pneumatic communication between said first and second chamber.

5. The apparatus as set forth in claim 4, wherein said bottom peripheral edge of said rectifying plate is located lower than an upper end of said partition wall.

6. The apparatus as set forth in claim 4, wherein the bottom peripheral edge of the rectifying plate is located lower than the upper end of the partition wall.

7. The apparatus as set forth in claim 1, wherein said frusto-conical outer surface extends from a position below an upper surface of said rotation means and is structured such that it will extend inside an outer edge of a substrate surface when said substrate is held on said rotation means and inside the outer edge of said substrate surface.

8. The apparatus as set forth in claim 1 or 7, wherein said first auxiliary chamber is located below the bottom peripheral edge of said frusto-conical outer surface of said rectifying plate.

9. The apparatus as set forth in claim 1, wherein said second auxiliary chamber is connected to said evacuation means and said preventing means comprises a partition wall disposed between said first and second chambers, said partition wall extending upwardly from the said bottom of said processing chamber and allowing a pneumatic communication between said first and second chambers via a slit formed at the upper edge of said partition wall.

10. The apparatus as set forth in claim 1, wherein said preventing means is constructed to prevent substantially all of said collected surplus solution from entering said second auxiliary chamber such that only air and processing solution mist enter said second auxiliary chamber.

* * * * *